(12) United States Patent
Chang et al.

(10) Patent No.: US 6,306,697 B1
(45) Date of Patent: Oct. 23, 2001

(54) LOW TEMPERATURE POLYSILICON MANUFACTURING PROCESS

(75) Inventors: Ting-Chang Chang, Hsinchu; Du-Zen Peng, Chu-Pei; Chun-Yen Chang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/755,579

(22) Filed: Jan. 5, 2001

(51) Int. Cl.$^7$ .................................................. H01L 21/84
(52) U.S. Cl. ........................................................ 438/166
(58) Field of Search ...................................... 438/199, 158, 438/166, 482, 485, 488, 489

(56) References Cited

U.S. PATENT DOCUMENTS

| | | | |
|---|---|---|---|
| 5,563,093 | * 10/1996 | Koda et al. | 437/101 |
| 6,013,565 | * 1/2000 | Fonash et al. | 438/478 |
| 6,177,302 | * 1/2001 | Yamazaki et al. | 438/158 |
| 6,235,563 | * 5/2001 | Oka et al. | 438/166 |

* cited by examiner

Primary Examiner—David Nelms
Assistant Examiner—Quoc Hoang
(74) Attorney, Agent, or Firm—Thomas, Kayden, Horstemeyer & Risley

(57) ABSTRACT

A low temperature polysilicon manufacturing method. A system for performing physical vapor deposition is used to form an amorphous silicon film with micro-crystals therein. The amorphous silicon film is annealed at a temperature between 400° C. to 500° C. for about 6 to 16 hours to form a polysilicon film. The polysilicon film can be further processed into a low-temperature polysilicon film transistor.

16 Claims, 2 Drawing Sheets

LOW TEMPERATURE POLYSILICON MANUFACTURING PROCESS

BACKGROUND OF THE INVENTION

1. Field of Invention

The present invention relates to a polysilicon manufacturing process. More particularly, the present invention relates to a low temperature polysilicon manufacturing process.

2. Description of Related Art

The use of polysilicon film in the fabrication of transistor products is very popular in recent years. Polysilicon film transistors are often used as switching devices in display unit. Compared with amorphous film transistors, polysilicon film transistors have higher carrier migration rate. Hence, a polysilicon film transistor can be smaller and can serve as a peripheral driver circuit, especially in high-resolution display. However, the growth of polysilicon film demands a relatively higher temperature so that not only is the thermal budget increased, but a more heat-resistant substrate is also required so that a higher production cost will result.

Conventionally, a polysilicon film layer is formed by one of the following methods:

1. Solid-Phase Crystallization (SPC): Conventional low-pressure chemical vapor deposition is used to form an amorphous film over a substrate. A high temperature annealing operation is carried out to grow crystals in the amorphous silicon film so that ultimately the amorphous silicon is transformed into a polysilicon film. A temperature of at least 600° C. is used in the annealing step.

2. Metal-Induced Crystallization (MIC): A metallic film is formed over an amorphous layer at a relatively low temperature so that silicon in the amorphous silicon film and metal in the metallic film react to form a silicide film. Thereafter, a portion of the silicon atoms in the silicide layer is leached out to form crystals. Hence, crystallization temperature changes according to temperature of the silicide material. In general, the crystallization temperature is about 500° C.

3. Excimer Laser Annealing (ELA): Excimer laser is beamed onto an amorphous silicon film at room temperature so that temperature of film rises rapidly to the boiling point of silicon almost instantaneously and then seeds the amorphous silicon film with crystal nucleus. Ultimately, the seed nuclei formed inside the amorphous silicon film grow in size to form a polysilicon film.

In the aforementioned methods, method one needs to use a high processing temperature of about 600° C. Hence, a higher thermal budget must be required and a higher heat resistant substrate must be used. In the second method, although a lower temperature can be used, residual metal in the polysilicon film often produces deep trap that may interference with conductive carriers. In the third method, due to short burst of energy by the laser beam, the silicon film may re-solidify so quickly that there is insufficient time to crystal out. In addition, the laser method can form a polysilicon film having a thickness from several tens of nanometers to a few hundred nanometers only. Moreover, uniformity of the polysilicon film is hard to control.

SUMMARY OF THE INVENTION

Accordingly, one object of the present invention is to provide an amorphous silicon film having micro-crystals therein that can be transformed into a polysilicon film at a temperature of around 400° C.

To achieve these and other advantages and in accordance with the purpose of the invention, as embodied and broadly described herein, the invention provides a low temperature polysilicon manufacturing method. A system for performing physical vapor deposition is used to form an amorphous silicon film with micro-crystals therein. The amorphous silicon film is annealed at a temperature between 400° C. to 500° C. for about 6 to 16 hours to form a polysilicon film. The polysilicon film can be further processed into a low-temperature polysilicon film transistor.

In the presence of micro-crystal nuclei within the amorphous silicon film of this invention, a relatively low temperature (between 400 to 500° C.) is required to transform the amorphous silicon into polysilicon. Hence, production cost can be reduced.

Since crystallization is conducted at a relatively low temperature, large crystals are formed. Hence, when the polysilicon film is used as a source/drain terminal, a higher conductivity is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1 and 2 a schematic cross-sectional views showing the progression of steps for forming a low temperature polysilicon film according to one preferred embodiment of this invention.

DESCRIPTION OF THE PREFERRED EMBODIMENTS

Figure 1:
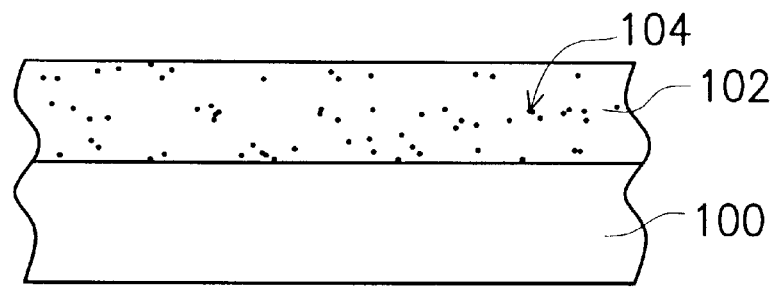
FIG. 1A is a picture taken using a high-resolution penetrating electron microscope showing a portion of the amorphous silicon film fabricated according to this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
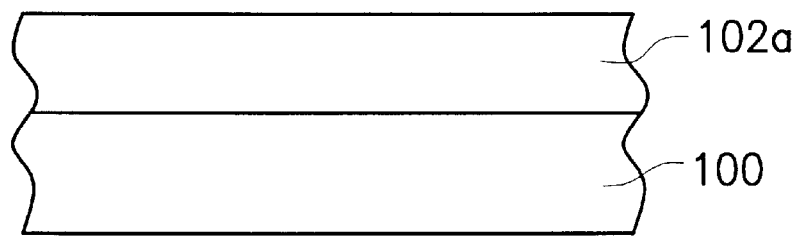

FIGS. 1 and 2 are schematic cross-sectional views showing the progression of steps for forming a low temperature polysilicon film according to one preferred embodiment of this invention.

As shown in FIG. 1, a physical vapor deposition is conducted to form an amorphous silicon layer 102 over a substrate 100. The amorphous silicon layer 102 contains a few micro-crystals 104 (magnified in the figure). The amorphous silicon layer 102 is formed, for example, by heating the substrate 100 to about 400° C. and then depositing amorphous silicon on the substrate 100 using an electron-gun evaporation system. The substrate 100 is formed from a material capable of withstanding 400° C. such as silicon dioxide or glass.

Figure 1A:
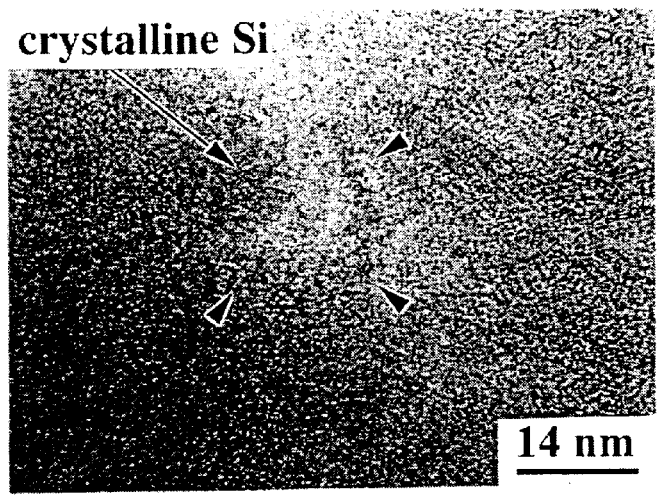

FIG. 1A is a picture taken using a high-resolution penetrating electron microscope showing a portion of the amorphous silicon film fabricated according to this invention. As shown in FIG. 1A, the area pointed to by an arrow contains a micro-crystal 104.

As shown in FIG. 2, an annealing process is carried out at a temperature between 400° C. to 500° C. for about 6 to 16 hours. Utilizing the micro-crystals 104 inside the amorphous silicon layer 102 as nuclei, bigger crystals are formed inside the amorphous silicon layer 102 to form a low-temperature polysilicon film 102a.

Figure 3:
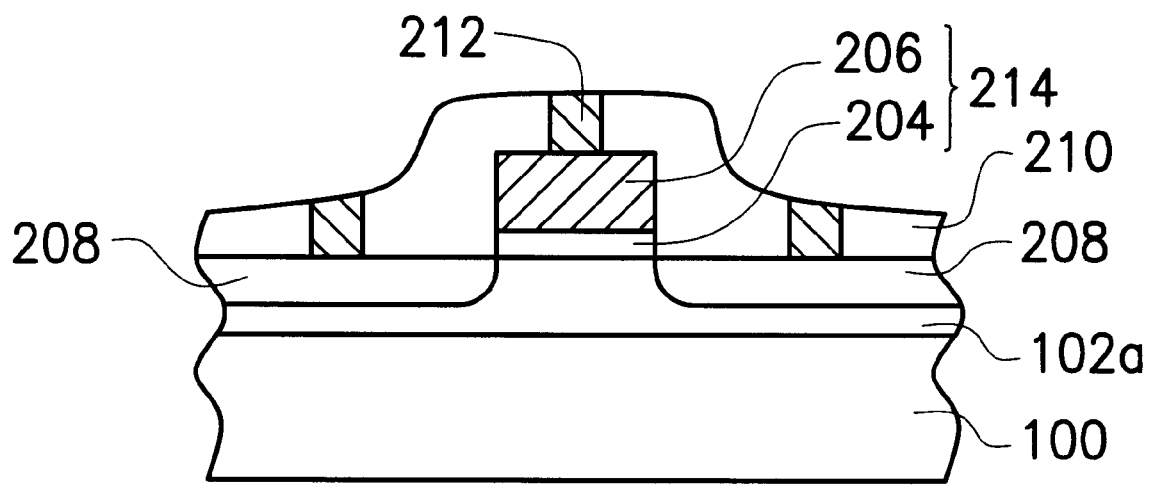
FIG. 3 is a schematic cross-sectional view of a metal-oxide-semiconductor transistor fabricated according to this invention.

FIG. 3 is a schematic cross-sectional view of a metal-oxide-semiconductor transistor fabricated according to this invention. A gate structure 214 is formed over the low-temperature polysilicon film 102a. The gate structure 214 comprises of a gate dielectric layer 204 and a gate electrode 106. The gate electrode 206 is formed using either polysilicon or polysilicon/silicide material.

An ion implantation is conducted to form source/drain regions 208 in the low-temperature polysilicon film 102a on each side of the gate structure 214. Photolithographic and etching processes are conducted to form openings (not labeled) in the dielectric layer 204. The openings expose a portion of the gate structure 214 and the source/drain regions 208. Conductive material is deposited into the openings to form contacts 212. The conductive material can be aluminum, copper or tungsten, for example.

In conclusion, the advantages of using the low-temperature polysilicon film of this invention includes:

1. The presence of micro-crystal nuclei within the amorphous silicon film of this invention, a relatively low temperature (between 400 to 500° C.) is required to transform the amorphous silicon into polysilicon. Hence, production cost can be reduced.
2. Since crystallization is conducted at a relatively low temperature, large crystals are formed. Hence, when the polysilicon film is used as a source/drain terminal, a higher conductivity is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low-temperature polysilicon manufacturing process, comprising the steps of:

providing a substrate;
   forming an amorphous silicon layer having a plurality of micro-crystals therein over the substrate; and
   performing an annealing treatment to transform the amorphous silicon layer into a polysilicon layer with large crystals therein.

2. The process of claim 1, wherein the annealing treatment is conducted at a temperature between about 400° C. to 500° C.

3. The process of claim 1, wherein the annealing treatment is conducted for a period between about 6 to 16 hours.

4. The process of claim 1, wherein the substrate is formed from silicon dioxide or glass.

5. The process of claim 1, wherein the step of forming the amorphous silicon layer includes physical vapor deposition.

6. The process of claim 5, wherein the physical vapor deposition includes electron-gun evaporation.

7. A method for forming a low-temperature polysilicon film transistor, comprising the steps of:

providing a substrate;
   forming an amorphous silicon layer having a plurality of micro-crystals therein over the substrate;
   performing a low temperature annealing treatment to transform the amorphous silicon layer into a low-temperature polysilicon layer having big crystals therein;
   sequentially forming a gate dielectric layer and a gate electrode over the low-temperature polysilicon layer; and
   conducting an ion implantation to form a source/drain region in the low-temperature polysilicon layer on each side of the gate electrode.

8. The method of claim 7, wherein the annealing treatment is conducted at a temperature between about 400° C. to 500° C.

9. The method of claim 7, wherein the annealing treatment is conducted for a period between about 6 to 16 hours.

10. The method of claim 7, wherein the substrate is formed from silicon dioxide or glass.

11. The method of claim 7, wherein the step of forming the amorphous silicon layer includes physical vapor deposition.

12. The method of claim 11, wherein the physical vapor deposition includes electron-gun evaporation.

13. The method of claim 7, wherein material constituting the dielectric layer includes low-temperature silicon oxide.

14. The method of claim 7, wherein material constituting the gate electrode includes polysilicon or polysilicon/silicide.

15. The method of claim 7, wherein after the step of forming the source/drain regions, further includes:

forming a dielectric layer over the low-temperature polysilicon layer so that the source/drain regions and the gate electrode are covered;
   removing a portion of the dielectric layer to form openings that expose a portion of the gate electrode and the source/drain regions; and
   forming a contact in each of the openings.

16. The method of claim 15, wherein the step of forming the contacts includes depositing aluminum, copper or tungsten.

* * * * *